United States Patent
Shen et al.

(10) Patent No.: US 9,613,675 B2
(45) Date of Patent: Apr. 4, 2017

(54) SYSTEM AND METHOD TO PERFORM LOW POWER MEMORY OPERATIONS

(71) Applicant: QUALCOMM Incorporated, San Diego, CA (US)

(72) Inventors: Jian Shen, San Diego, CA (US); Lew Go Chua-Eoan, Carlsbad, CA (US)

(73) Assignee: Qualcomm Incorporated, San Diego, CA (US)

( * ) Notice: Subject to any disclaimer, the term of this patent is extended or adjusted under 35 U.S.C. 154(b) by 100 days.

(21) Appl. No.: 14/106,730

(22) Filed: Dec. 14, 2013

(65) Prior Publication Data

US 2015/0170727 A1 Jun. 18, 2015

(51) Int. Cl.
*G11C 7/10* (2006.01)
*G11C 11/16* (2006.01)
*G11C 7/12* (2006.01)

(52) U.S. Cl.
CPC ........ *G11C 11/1675* (2013.01); *G11C 7/1009* (2013.01); *G11C 7/109* (2013.01); *G11C 7/12* (2013.01); *G11C 11/1673* (2013.01); *G11C 2207/2263* (2013.01)

(58) Field of Classification Search
CPC .......... G11C 7/1009; G11C 7/109; G11C 7/12
USPC ............... 365/158, 148, 189.14, 189.07, 227
See application file for complete search history.

(56) References Cited

U.S. PATENT DOCUMENTS

| | | | |
|---|---|---|---|
| 3,311,893 A | 3/1967 | Landell | |
| 5,557,572 A * | 9/1996 | Sawada | G11C 16/16 365/185.22 |
| 5,777,923 A | 7/1998 | Lee et al. | |
| 5,784,320 A * | 7/1998 | Johnson | G11C 16/349 365/189.07 |
| 5,886,930 A * | 3/1999 | Maclellan | G11C 7/1015 365/189.02 |
| 6,052,302 A | 4/2000 | Moyer et al. | |
| 6,052,305 A | 4/2000 | Yang et al. | |
| 6,693,824 B2 | 2/2004 | Nahas et al. | |
| 6,909,631 B2 | 6/2005 | Durlam et al. | |
| 7,817,462 B2 | 10/2010 | Miura et al. | |
| 7,830,726 B2 | 11/2010 | Huang et al. | |
| 8,374,025 B1 * | 2/2013 | Ranjan | B82Y 10/00 365/148 |
| 8,488,363 B2 | 7/2013 | Rao et al. | |
| 2002/0159286 A1 | 10/2002 | Sunaga et al. | |
| 2003/0128578 A1 | 7/2003 | Perner | |
| 2003/0182607 A1 * | 9/2003 | Onodera | G11C 29/36 714/719 |

(Continued)

OTHER PUBLICATIONS

International Search Report and Written Opinion for International Application No. PCT/US2014/067756, ISA/EPO, Date of Mailing Feb. 4, 2015, 10 pages.

(Continued)

*Primary Examiner* — Hoai V Ho
*Assistant Examiner* — Jay Radke
(74) *Attorney, Agent, or Firm* — Toler Law Group, PC

(57) ABSTRACT

A method includes performing a memory operation at a magnetic tunnel junction (MTJ) storage element by, during a single memory clock cycle, reading a first value stored at the MTJ storage element, comparing the first value to a second value to be stored at the MTJ storage element, and selectively writing the second value to the MTJ storage element based on the comparison.

30 Claims, 5 Drawing Sheets

(56) References Cited

U.S. PATENT DOCUMENTS

| | | |
|---|---|---|
| 2004/0105299 A1* | 6/2004 | Joshi .................... G11C 11/413 365/154 |
| 2006/0044867 A1 | 3/2006 | Ise |
| 2007/0136623 A1* | 6/2007 | Perego ............ G01R 31/31709 714/704 |
| 2009/0073756 A1 | 3/2009 | Yang |
| 2009/0097336 A1* | 4/2009 | Kang .................... G11C 11/56 365/189.14 |
| 2009/0285008 A1* | 11/2009 | Jeong ...................... G11C 8/10 365/148 |
| 2009/0296458 A1* | 12/2009 | Lee ........................ G11C 11/56 365/163 |
| 2009/0303776 A1* | 12/2009 | Mair .................... G11C 11/412 365/154 |
| 2010/0067281 A1 | 3/2010 | Xi et al. |
| 2010/0091585 A1* | 4/2010 | Wang .................. G11C 11/413 365/189.011 |
| 2010/0214825 A1 | 8/2010 | Chung et al. |
| 2010/0232206 A1 | 9/2010 | Li et al. |
| 2010/0315890 A1* | 12/2010 | Yen-Huei .............. G11C 11/413 365/191 |
| 2011/0007551 A1 | 1/2011 | Tian et al. |
| 2011/0026336 A1* | 2/2011 | Huang .................. G11C 7/1006 365/189.14 |
| 2011/0063899 A1 | 3/2011 | Ogimoto |
| 2011/0280065 A1* | 11/2011 | Rao ........................ G11C 11/16 365/171 |
| 2012/0087182 A1* | 4/2012 | Kim .................... G11C 13/0004 365/163 |
| 2013/0279243 A1 | 10/2013 | Huang |
| 2014/0050033 A1* | 2/2014 | Otto ...................... G11C 11/412 365/189.02 |
| 2015/0302925 A1* | 10/2015 | Oh ..................... G11C 13/0069 365/148 |

OTHER PUBLICATIONS

International Search Report and Written Opinion—PCT/US2011/035725—ISA/EPO—Oct. 10, 2011.

* cited by examiner

SYSTEM AND METHOD TO PERFORM LOW POWER MEMORY OPERATIONS

I. FIELD

The present disclosure is generally related to a system and method to perform low power memory operations.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application that can be used to access the Internet. As such, these wireless telephones can include significant computing capabilities.

Electronic devices, such as wireless telephones, may include magnetic tunnel junction (MTJ) storage elements. At a magnetic tunnel junction (MTJ) storage element, a write operation may use more energy than a read operation. For example, a single-bit write operation in a 45 nanometer (nm) MTJ may use a 25 microampere (uA) pulse over 100 nanoseconds (ns). A single-bit read operation in the 45 nm MTJ may use less than a 10 uA pulse over 1 ns. Hence, a single-bit write operation may use more than 250 times the energy used in a single-bit read operation.

One energy-saving approach includes initially performing a write operation using a low write voltage (e.g., just above a write threshold voltage) to write a value to a storage location. A read operation may be performed to read a stored value from the storage location. If the write value does not match the stored value, another write operation may be performed using an elevated write voltage. Using this approach may reduce the energy consumption of performing a memory operation when the initial low voltage write operation is successful. However, a cycle latency associated with the memory operation occurs when the initial low voltage write operation is unsuccessful and the additional elevated write operation is performed. The cycle latency may result in a gap (or bubble) in an instruction pipeline, causing performance inefficiencies.

III. SUMMARY

Systems and methods of performing low power memory operations are disclosed. In accordance with the present disclosure, a memory operation of a MTJ storage element may include reading a stored value from the MTJ storage element, comparing the stored value to a write value to be written to the MTJ storage element, and selectively writing the write value to the MTJ storage element based on the comparison. For example, a write operation may only be performed when the stored value is to be changed. Using this approach may reduce energy consumption by avoiding expending energy to perform write operations that would not change the stored value. Further, because at most one write operation is performed, the described approach may avoid introducing gaps in an instruction execution pipeline.

In a particular embodiment, a method includes performing a memory operation at a magnetic tunnel junction (MTJ) storage element by, during a single memory clock cycle, reading a first value stored at the MTJ storage element, comparing the first value to a second value to be stored at the MTJ storage element, and selectively writing the second value to the MTJ storage element based on the comparison.

In another particular embodiment, an apparatus includes circuitry coupled to a magnetic tunnel junction (MTJ) storage element. The circuitry is configured, during a single memory clock cycle, to receive a first value stored at the MTJ storage element, to receive a second value to be written to the MTJ storage element, to compare the first value to the second value, and to selectively enable a write operation of the second value to the MTJ storage element based on the comparison.

In another particular embodiment, an apparatus includes an array of magnetic tunnel junction (MTJ) storage elements including a first MTJ storage element, a multiplexer (MUX), circuitry coupled to the array of MTJ storage elements and to the MUX, and a write pulse generator. The circuitry is configured to receive a first value stored at the first MTJ storage element, to receive a second value from the MUX, the second value to be written to the first MTJ storage element, to compare the first value to the second value, and to selectively transmit a write enable signal to a write pulse generator based on the comparison.

One particular advantage provided by at least one of the disclosed embodiments is that the energy consumption of performing a memory operation may be reduced. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
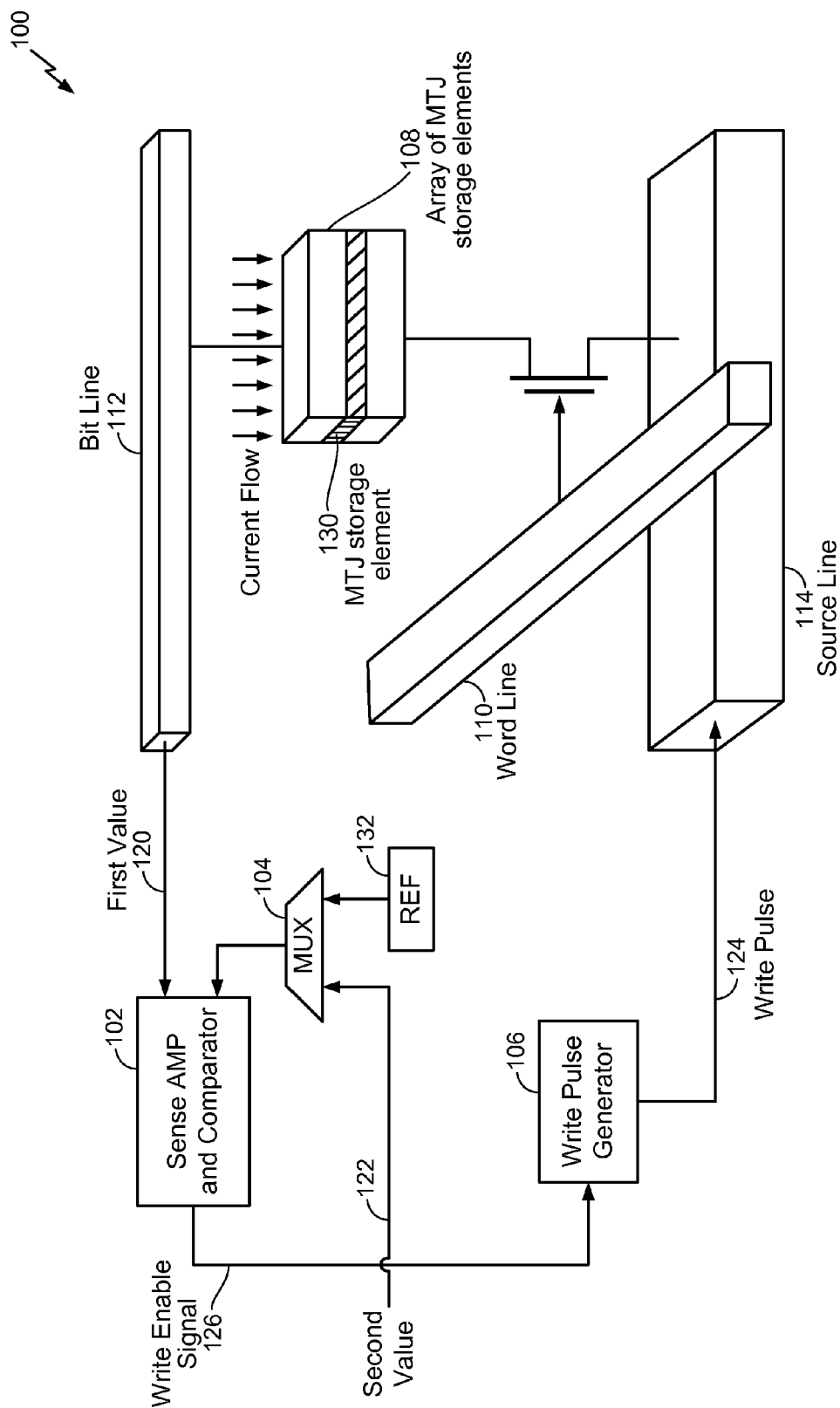
FIG. 1 is a diagram to illustrate a particular embodiment of a system that is operable to perform low power memory operations.

Referring to FIG. 1, a particular illustrative embodiment of a system that performs low power memory write operations is disclosed and generally designated 100. The system 100 includes an array of MTJ storage elements 108. For example, the system 100 may include a magnetoresistive random-access memory (MRAM) device. The MRAM device may include the array of MTJ storage elements 108. Each MTJ storage element (e.g., an illustrative MTJ storage element 130) may be configured to store a logic state (e.g., logic 0 or logic 1). For example, a current may be used to align an orientation of a magnetic moment of a free magnetic layer of the MTJ storage element 130 relative to a fixed magnetic layer of the MTJ storage element 130. When the free magnetic layer has the same orientation as the fixed magnetic layer, the MTJ storage element 130 may be in a parallel state and may have a first resistance value. The first resistance value may represent a particular logic state (e.g., logic 0). When the free magnetic layer has a different orientation from the fixed magnetic layer, the MTJ storage element 130 may be in an anti-parallel state and may have a second resistance value. The second resistance value may represent another particular logic state (e.g., logic 1). When the MTJ storage element 130 is read, the first resistance value may correspond to a first current value (or first voltage value) that indicates the particular logic state, and the second resistance value may correspond to a second current value (or second voltage value) that indicates the other logic state.

The array of MTJ storage elements 108 may include a plurality of columns of MTJ storage elements and a plurality of rows of MTJ storage elements. For example, the MTJ storage element 130 may be included in a first column of MTJ storage elements and a first row of MTJ storage elements. Each column of the array of MTJ storage elements 108 may correspond to (e.g., may be accessed using) a particular bit line. For example, each MTJ storage element of the first column, including the MTJ storage element 130, may be coupled to a bit line 112. Each row of the array of MTJ storage elements 108 may correspond to a particular word line. For example, each MTJ storage element of the first row, including the MTJ storage element 130, may be coupled to a word line 110. Each MTJ storage element of the array of storage elements 108 (e.g., the MTJ storage element 130) may also be coupled to a source line 114, as shown.

Each bit line (e.g., the bit line 112) may be coupled to circuitry (e.g., a sense amplifier (AMP) and comparator 102). In a particular embodiment, the sense amplifier and comparator 102 may also be coupled to a multiplexer (MUX) 104. The MUX 104 may have a first input and a second input. The MUX 104 may be configured to selectively provide the first input or the second input to the sense AMP and comparator 102 based on a control signal (not shown). For example, the MUX 104 may provide the first input to the sense AMP and comparator 102 when the control signal indicates a write operation and may provide a second input to the sense AMP and comparator 102 when the control signal indicates a read operation. To illustrate, the MUX 104 may provide a reference value (REF) 132 to the sense AMP and comparator 102 when the control signal indicates a read operation. REF 132 may correspond to a reference voltage (or a reference current) that represents a lowest resistance value that is considered a particular logic value (e.g., logic 1). The sense AMP and comparator 102 may be coupled to a write pulse generator 106. The write pulse generator 106 may be coupled to the source line 114.

During operation, a first value 120 may initially be stored at the MTJ storage element 130. For example, the MTJ storage element 130 may have a particular resistance corresponding to a particular logic state (e.g., logic 0 or logic 1). A memory controller, coupled to the system 100, may receive a write request (e.g., from a processor). The write request may include a second value 122 to be written at a specified memory location (e.g., the MTJ storage element 130). In response to the write request, the memory controller may initiate a read operation at the MTJ storage element 130 by selecting the bit line 112 and the word line 110, causing a first current to flow between the bit line 112 and the source line 114. The first current may pass through the MTJ storage element 130. The first current may have a first current magnitude (e.g., less than 10 microampere (uA)) and may be applied for a first time period (e.g., 1 nanosecond (ns)). The logic state (e.g., the first value 120) of the MTJ storage element 130 may be determined based on the particular resistance of the MTJ storage element 130. The sense amplifier and comparator 102 may receive the first value 120 from the bit line 112. For example, the sense AMP and comparator 102 may receive the first current that passed through the MTJ storage element 130. In a particular embodiment, the first current may be converted to a first voltage. In this embodiment, the sense AMP and comparator 102 may receive the first voltage.

The memory controller may also provide the second value 122 to the sense AMP and comparator 102. For example, the memory controller may provide the second value 122 to the first input of the MUX 104 and a control signal to the MUX 104 indicating a write operation. The MUX 104 may transmit the second value 122 to the sense AMP and comparator 102 in response to determining that the control signal indicates a write operation. For example, the MUX 104 may transmit a second current (or a second voltage) corresponding to the second value 122 to the sense AMP and comparator 102.

The sense AMP and comparator 102 may compare the first value 120 and the second value 122. The sense AMP and comparator 102 may selectively enable a write of the second value 122 to the MTJ storage element 130 based on the comparison. For example, the sense AMP and comparator 102 may generate a write enable signal 126 in response to determining that the first value 120 (e.g., corresponding to logic 0) and the second value 122 (e.g., corresponding to logic 1) do not match. In this case, the sense AMP and comparator 102 may transmit the write enable signal 126 to the write pulse generator 106. In response to receiving the write enable signal 126, the write pulse generator 106 transmits a write pulse 124 to the source line 114. In response to the write pulse 124, the second value 122 is written to the MTJ storage element 130. For example, the source line 114 and the bit line 112 may be set, causing a second current to toggle (e.g., "flip") the logic value stored the MTJ storage element 130 by reversing an orientation of a magnetic moment of a free magnetic layer of the MTJ storage element 130. In a particular embodiment, grounding the source line 114, connecting the bit line 112 to a power supply, and generating the second current between the bit line 112 and the source line 114 may store a logic 0 in the MTJ storage element 130 when the word line 110 is activated. In this embodiment, grounding the bit line 112, connecting the source line 114 to the power supply, and generating the second current between the bit line 112 and the source line 114 may store a logic 1 in the MTJ storage element 130 when the word line 110 is activated. The second current may have a second current magnitude (e.g., 25 uA) and may be applied for a second time period (e.g., 100 ns).

The sense AMP and comparator 102 may refrain from causing the second value 122 to be written in the MTJ storage element 130 in response to determining that the first value 120 and the second value 122 match. For example, the sense AMP and comparator 102 may refrain from generating the write enable signal 126 in response to determining that the first value 120 and the second value 122 both correspond to logic 0 or logic 1. The sense AMP and comparator 102 may thus avoid generation of a write current in situations where a write operation would not change the value stored in a MTJ storage element.

In a particular embodiment, a memory operation initiated by the memory controller may be performed within a single memory clock cycle. For example, the sense AMP and comparator 102 may receive the first value 120, compare the first value 120 to the second value 122, and selectively write the second value 122 to the MTJ storage element 130 within a single memory clock cycle.

In a particular embodiment, the sense AMP and comparator 102 may include a separate sense AMP and a comparator. In this embodiment, the sense AMP may receive the first value 120 from the bit line 112 and may receive the REF 132. The sense AMP may amplify the first value 120 and provide the amplified first value 120 to the comparator. The comparator may also receive the second value 122. For example, the memory controller may provide the second value 122 to the comparator. The comparator may compare the first value 120 and the second value 122 and may selectively generate the write enable signal 126 based on the comparison. For example, the comparator may perform an exclusive-or (XOR) operation on the first value 120 and the second value 122, where a result of the XOR operation corresponds to the write enable signal 126.

In a particular embodiment, a first plurality of values (e.g., "01010100") may be stored at a particular memory location (e.g., a particular word) of the array of MTJ storage elements 108. The write request from the processor may indicate that a second plurality of values (e.g., "10010100") is to be written to the particular word. The MTJ storage element 130 may correspond to a particular bit (e.g., the second bit) of the particular word. In response to the write request, the memory controller may initiate a memory operation at the particular word. For example, the memory controller may select the word line 110 and a plurality of bit lines (including the bit line 112) corresponding to a plurality of MTJ storage elements associated with the particular word. The sense AMP and comparator 102 may read the first plurality of values (e.g., "01010100") stored at the particular word. For example, the sense AMP and comparator 102 may receive the first plurality of values, including the first value 120, from the plurality of bit lines.

The sense AMP and comparator 102 may compare the first plurality of values to the second plurality of values and may selectively write one or more of the second plurality of values to a corresponding MTJ storage element based on the comparison. For example, the sense AMP and comparator 102 may determine that logic values stored at MTJ storage elements corresponding to the first bit (e.g., 0) and second bit (e.g., 1) do not match the logic values to be stored at the first bit (e.g., 1) and the second bit (e.g., 0). In response to the determination, the sense AMP and comparator 102 may enable a write to the first bit and the second bit and may disable a write to the remaining bits. For example, the sense AMP and comparator 102 may transmit the write enable signal 126 to write pulse generators (e.g., the write pulse generator 106) corresponding to the first bit and the second bit and may refrain from transmitting the write enable signal 126 to write pulse generators corresponding to the remaining bits. In a particular embodiment, the sense AMP and comparator 102 may receive the first plurality of values, receive the second plurality of values, compare the first plurality of values to the second plurality of values, and selectively enable a write operation of one or more of the second plurality of values within a single memory clock cycle.

A write to a MTJ storage element may be more energy intensive than a read from the MTJ storage element. Refraining from writing to the MTJ storage element when the value stored at the MTJ storage element matches the value to be written to the MTJ storage element reduces the energy consumption associated with write operations to memory. Further, performing the memory operation within a single memory clock cycle may prevent a gap in an instruction pipeline resulting from a memory operation that takes longer than a single memory clock cycle.

Figure 2:
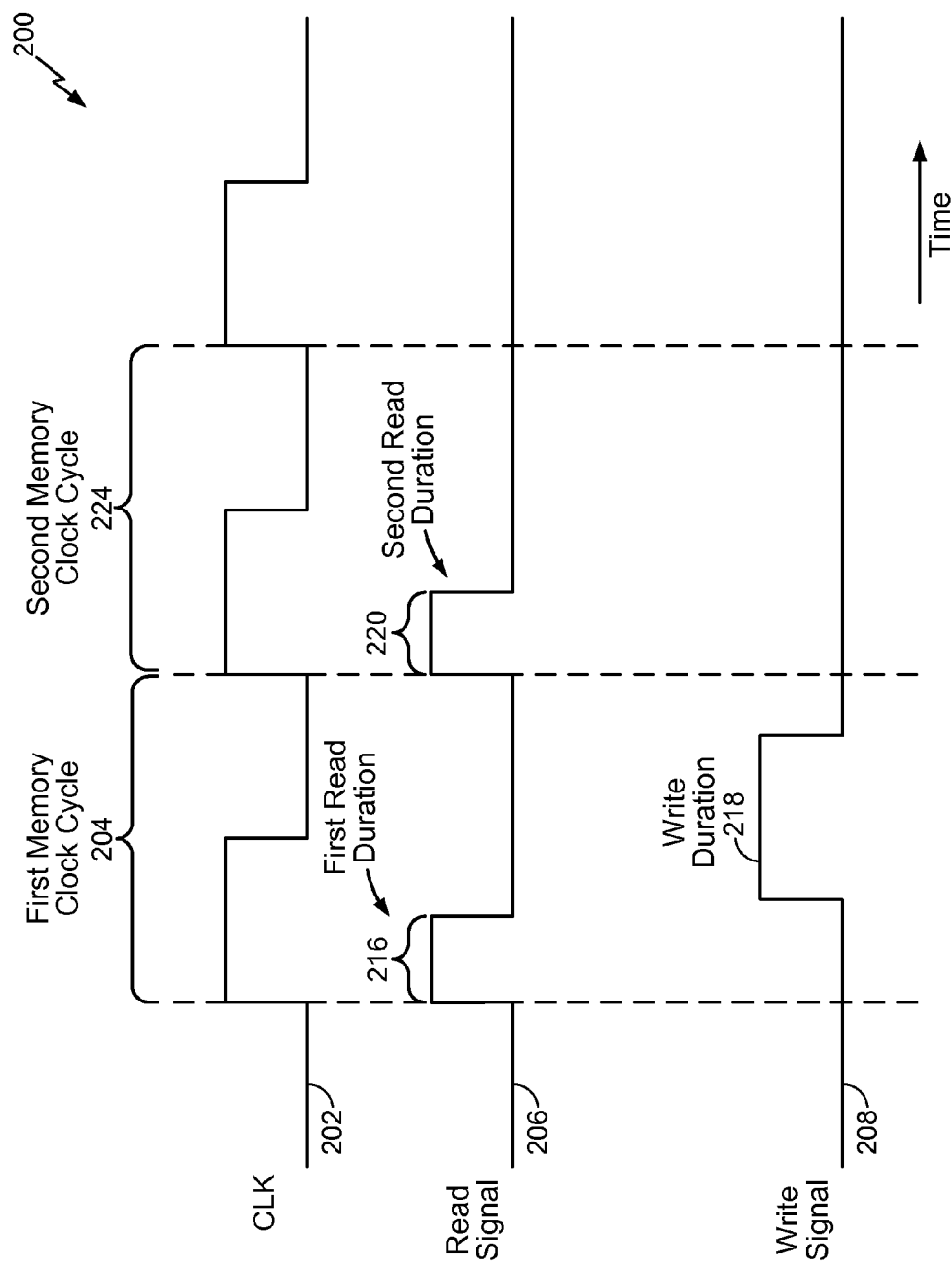
FIG. 2 is a timing diagram to illustrate signal traces corresponding to a low power memory operation.

Referring to FIG. 2, a timing diagram to illustrate signal traces corresponding to a low power memory operation is disclosed and generally designated 200. In a particular embodiment, the timing diagram may correspond to a memory operation at the system 100 of FIG. 1.

The timing diagram 200 includes a clock signal (CLK) 202. One cycle of the CLK 202 corresponds to a memory clock cycle (e.g., a first memory clock cycle 204 or a second memory clock cycle 224). The timing diagram 200 also includes a read signal 206 and a write signal 208.

During operation, the memory controller may initiate a read operation of a MTJ storage element (e.g., the MTJ storage element 130), as further described with reference to FIG. 1. For example, the memory controller may assert the read signal 206 to cause the first current to flow between the bit line 112 and the source line 114. In a particular embodiment, the memory controller may generate the read signal 206 in response to a write request from a processor.

For example, during the first memory clock cycle 204, the read signal 206 may be asserted for a first read duration 216. As illustrated in FIG. 2, the first read duration 216 may correspond to less than a first half of the memory clock cycle 204. The sense AMP and comparator 102 may receive the first value 120 at, or near, the end of the first read duration 216. The sense AMP and comparator 102 may compare the first value 120 and the second value 122 and may selectively generate the write enable signal 126, as further described with reference to FIG. 1. For example, the sense AMP and comparator 102 may activate the write enable signal 126 in response to determining that the first value 120 and the second value 122 do not match. In response to the write enable signal 126, the write pulse generator 106 may generate the write pulse 124 to cause a second current to flow between the bit line 112 and the source line 114. In a particular embodiment, the write signal 208 may correspond to the write pulse 124. The write signal 208 may be activated for a write duration 218. As illustrated in FIG. 2, the write duration 218 may be longer than the first read duration 216, but both the first read duration 216 and the write duration 218 may occur during the single first memory clock cycle 204.

As another example, during the second memory clock cycle 224, the memory controller may reassert the read signal 206 in response to another write request from the processor for a MTJ storage element (e.g., the MTJ storage element 130). The read signal 206 may be asserted during a next memory clock cycle (e.g., the second memory clock cycle 224) after the first memory clock cycle 204 because the previous write request is processed within the single first memory clock cycle 204 and does not introduce a gap in an instruction execution pipeline. The read signal 206 may be asserted for a second read duration 220. The sense AMP and comparator 102 may determine that a value stored by the MTJ storage element 130 matches another value to be written to the MTJ storage element 130. In response to the determination, the sense AMP and comparator 102 may not activate the write signal 208 during the second memory clock cycle 224.

Performing the memory operation within a single memory clock cycle may prevent a gap in an instruction pipeline resulting from a memory operation that takes longer than a single memory clock cycle.

Figure 3:
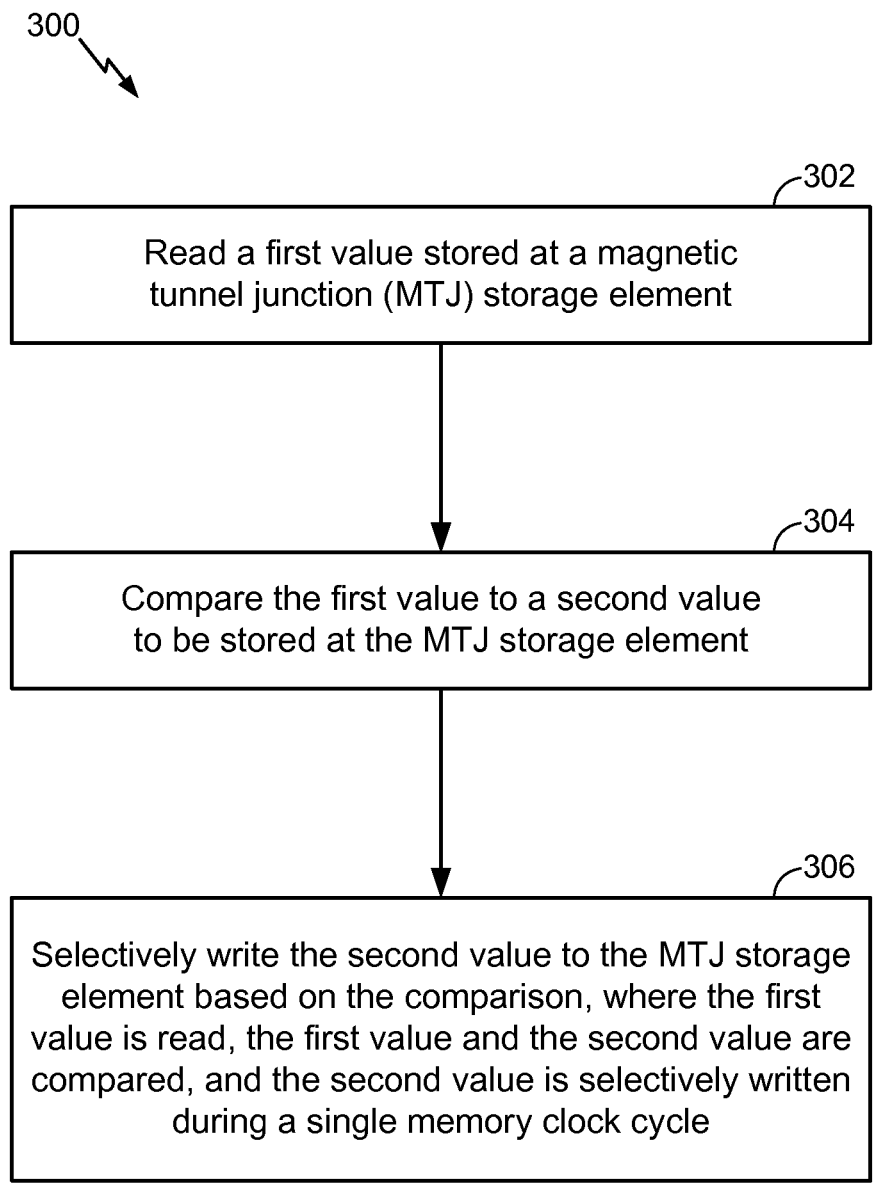
FIG. 3 is a flowchart to illustrate a particular embodiment of a method of performing a low power memory operation.

FIG. 3 is a flowchart to illustrate a particular embodiment of a method 300 of performing a low power memory operation. In an illustrative embodiment, the method 300 may be performed by the system 100 of FIG. 1.

The method 300 includes reading a first value stored at a magnetic tunnel junction (MTJ) storage element, at 302. For example, the sense AMP and comparator 102 of FIG. 1 may read the first value 120 stored at the MTJ storage element 130, as further described with reference to FIG. 1.

The method 300 also includes comparing the first value to a second value to be stored at the MTJ storage element, at 304. For example, the sense AMP and comparator 102 may compare the first value 120 to the second value 122, as further described with reference to FIG. 1.

The method 300 further includes selectively writing the second value to the MTJ storage element based on the comparison, at 306. The first value is read, the first value and the second value are compared, and the second value is selectively written during a single memory clock cycle. For example, the sense AMP and comparator 102 may selectively write the second value 122 to the MTJ storage element 130 based on the comparison, as further described with reference to FIG. 1. To illustrate, the sense AMP and comparator 102 may generate the write enable signal 126 to write the second value 122 to the MTJ storage element 130 in response to determining that the first value 120 does not match the second value 122. The sense AMP and comparator 102 may refrain from generating the write enable signal 126 in response to determining that the first value 120 and the second value 122 match. The sense AMP and comparator 102 may read the first value 120, compare the first value 120 and the second value 122, and selectively write the second value 122 within a single memory clock cycle, as further described with reference to FIGS. 1-2.

The method 300 may refrain from writing to the MTJ storage element when the value stored at the MTJ storage element matches the value to be written to the MTJ storage element and may thereby reduce the energy consumption associated with write operations to memory. Further, performing the memory operation during a single memory clock cycle may prevent introduction of a gap in an instruction pipeline.

The method 300 of FIG. 3 may be initiated by a processing unit such as a central processing unit (CPU), a field-programmable gate array (FPGA) device, an application-specific integrated circuit (ASIC), a controller, another hardware device, a firmware device, or any combination thereof.

Figure 4:
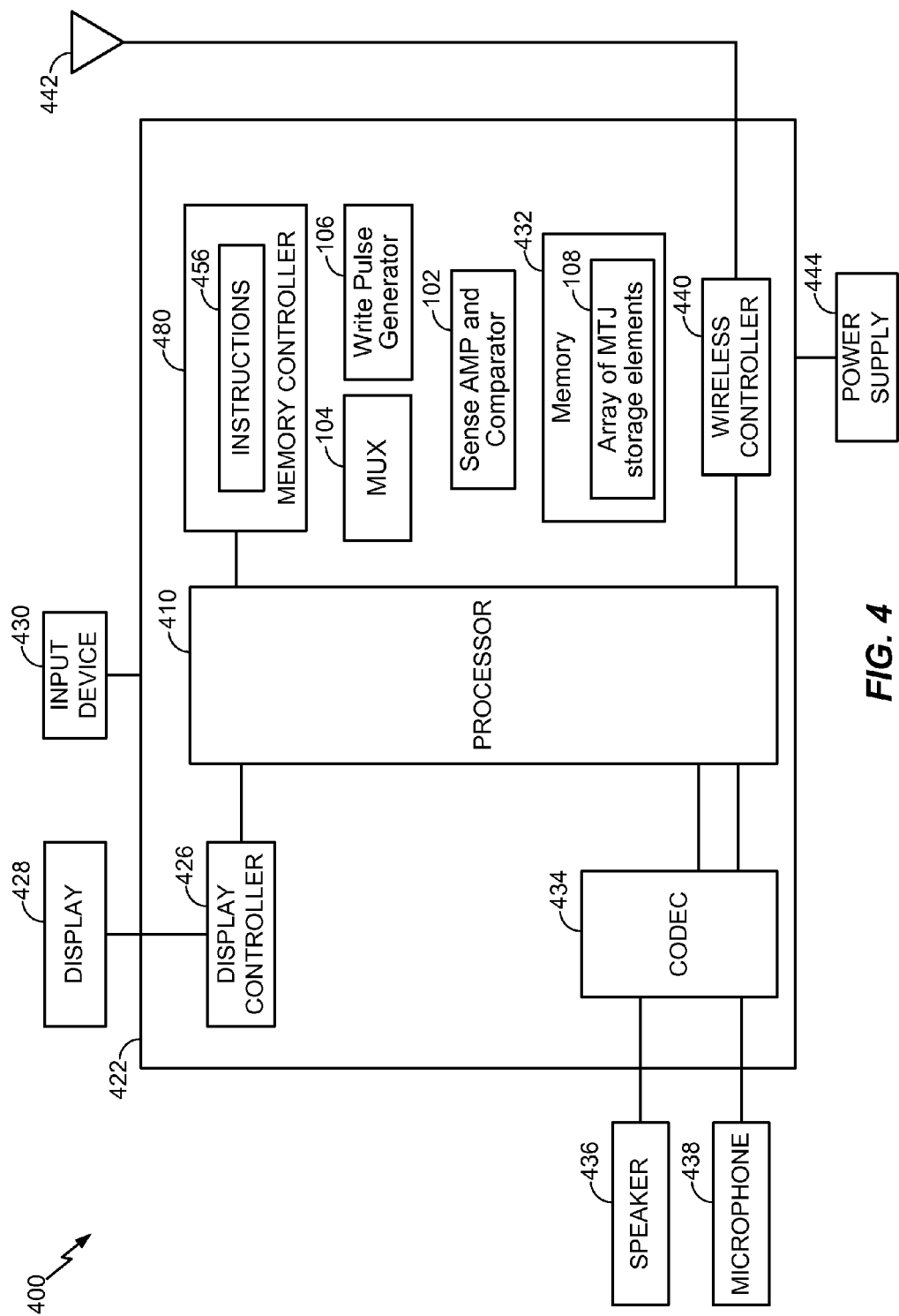
FIG. 4 is a block diagram of a device that includes components operable to perform a low power memory operation.

Referring to FIG. 4, a block diagram of a device is disclosed and generally designated 400. The device 400 (e.g., a wireless device) includes a processor 410, such as a digital signal processor (DSP) or a central processing unit (CPU), coupled to a memory 432. The memory 432 may include the array of MTJ storage elements 108 of FIG. 1. The device 400 also includes a display controller 426 coupled to the processor 410 and to a display 428. A coder/decoder (CODEC) 434 may also be coupled to the processor 410. A speaker 436 and a microphone 438 may be coupled to the CODEC 434.

FIG. 4 further indicates that a wireless controller 440 may be coupled to the processor 410 and to an antenna 442. The device 400 may include the MUX 104, the write pulse generator 106, the sense AMP and comparator 102 of FIG. 1, or a combination thereof. The device 400 may include a memory controller 480. The memory controller 480 may be a tangible non-transitory processor-readable storage medium that includes executable instructions 456. The instructions 456 may be executed by a processor, such as a processor within the memory controller 480, to perform or initiate performance of one or more of operations, functions, and/or methods. In a particular embodiment, the memory controller 480 may correspond to the memory controller described with respect to FIG. 1.

In a particular embodiment, the processor 410, the display controller 426, the memory 432, the CODEC 434, the memory controller 480, the MUX 104, the write pulse generator 106, the sense AMP and comparator 102, and the wireless controller 440 are included in a system-in-package or system-on-chip device 422. In a particular embodiment, an input device 430 and a power supply 444 are coupled to the system-on-chip device 422. Moreover, in a particular embodiment, as illustrated in FIG. 4, the display 428, the input device 430, the speaker 436, the microphone 438, the antenna 442, and the power supply 444 are external to the system-on-chip device 422. However, each of the display 428, the input device 430, the speaker 436, the microphone 438, the antenna 442, and the power supply 444 can be coupled to a component of the system-on-chip device 422, such as an interface or a controller.

In conjunction with the described embodiment, an apparatus includes first means for storing a plurality of data elements including a first data element. For example, the first means for storing may include the array of MTJ storage elements 108 of FIG. 1 or FIG. 4, one or more other devices or circuits configured to store a plurality of data elements, or any combination thereof.

The apparatus also includes first means for receiving a first value stored at the first data element. For example, the first means for receiving may include the sense AMP and comparator 102 of FIG. 1 or FIG. 4, one or more other devices or circuits configured to receive a first value, or any combination thereof.

The apparatus further includes second means for receiving a second value from a multiplexer (MUX), the second value to be written to the first data element. For example, the second means for receiving may include the sense AMP and comparator 102 of FIG. 1 or FIG. 4, one or more other devices or circuits configured to receive a second value, or any combination thereof.

The apparatus also includes means for comparing the first value to the second value. For example, the means for comparing may include the sense AMP and comparator 102 of FIG. 1 or FIG. 4, one or more other devices or circuits configured to compare, or any combination thereof.

The apparatus further includes means for selectively transmitting a write enable signal to means for generating a write pulse based on a result from the means for comparing. The write pulse enables a write of the second value to the first data element. For example, the means for selectively transmitting may include the sense AMP and comparator 102 of FIG. 1 or FIG. 4, one or more other devices or circuits configured to selectively transmit a write enable signal, or any combination thereof. For example, the means for selectively transmitting may refrain from transmitting the write enable signal in response to the result from the means for comparing indicating that the first value matches the second value. As another example, the means for selectively transmitting may transmit the write enable signal in response to the result from the means for comparing indicating that the first value does not match the second value.

Figure 5:
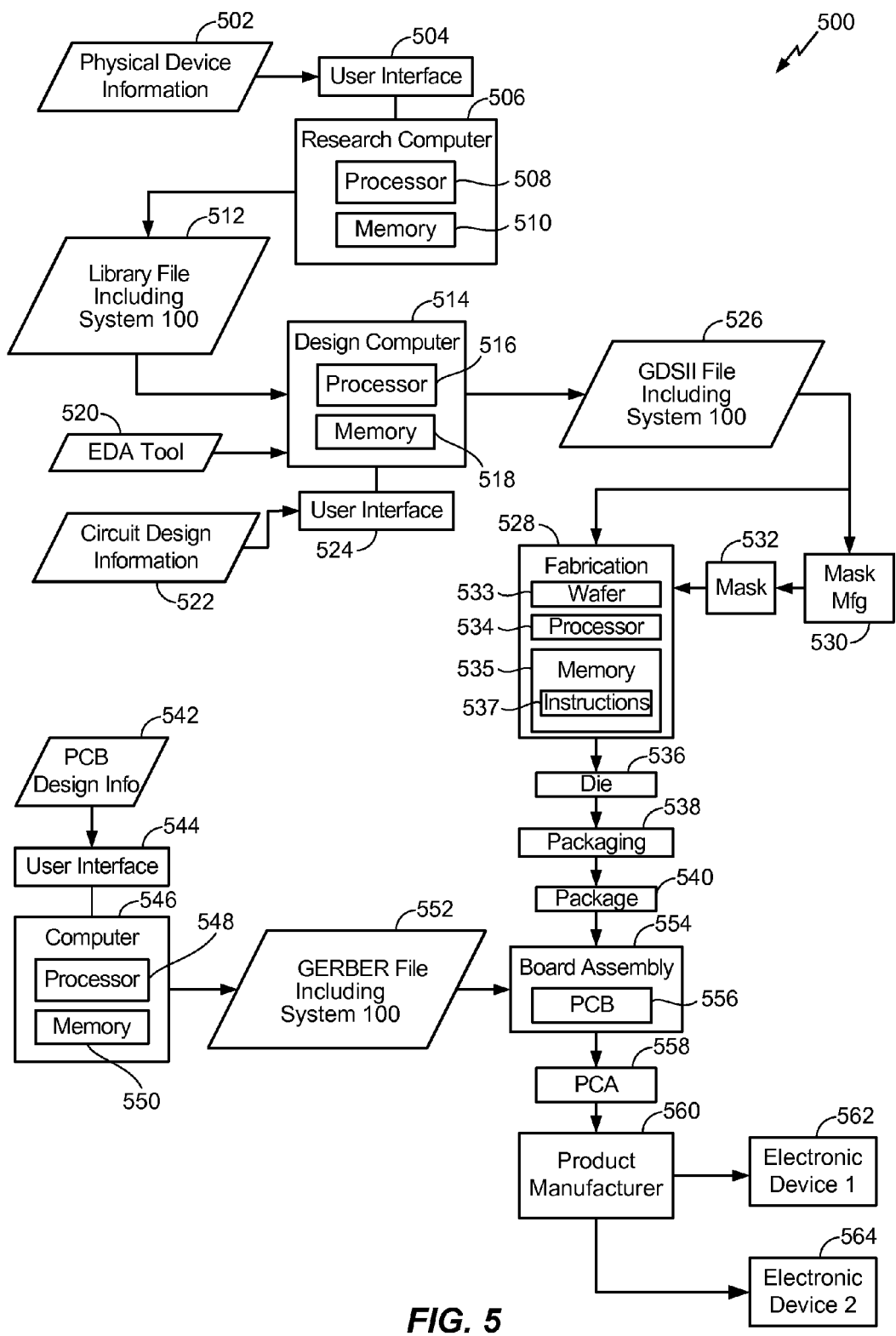
FIG. 5 is a data flow diagram of a particular illustrative embodiment of a manufacturing process to manufacture electronic devices that include the system of FIG. 1.

The foregoing disclosed devices and functionalities may be designed and configured into computer files (e.g. RTL, GDSII, GERBER, etc.) stored on computer-readable media. Some or all such files may be provided to fabrication handlers to fabricate devices based on such files. Resulting products include wafers that are then cut into dies and packaged into chips. The chips are then employed in devices including, but not limited to, a mobile phone, a communications device, a set top box, a music player, a video player, an entertainment unit, a navigation device, a personal digital assistant (PDA), a fixed location data unit, or a computer. FIG. 5 depicts a particular illustrative embodiment of an electronic device manufacturing process 500.

Physical device information 502 is received at the manufacturing process 500, such as at a research computer 506. The physical device information 502 may include design information representing at least one physical property of a semiconductor device, such as the system 100 (or any components thereof, such as the MUX 104, the write pulse generator 106, the sense AMP and comparator 102, the array of MTJ storage elements 108 of FIG. 1, or any combination thereof). For example, the physical device information 502 may include physical parameters, material characteristics, and structure information that is entered via a user interface 504 coupled to the research computer 506. The research computer 506 includes a processor 508, such as one or more processing cores, coupled to a computer readable medium such as a memory 510. The memory 510 may store computer readable instructions that are executable to cause the processor 508 to transform the physical device information 502 to comply with a file format and to generate a library file 512.

In a particular embodiment, the library file 512 includes at least one data file including the transformed design information. For example, the library file 512 may include a library of semiconductor devices including a device that includes the system 100 (or any components thereof, such as the MUX 104, the write pulse generator 106, the sense AMP and comparator 102, the array of MTJ storage elements 108 of FIG. 1, or any combination thereof), that is provided for use with an electronic design automation (EDA) tool 520.

The library file 512 may be used in conjunction with the EDA tool 520 at a design computer 514 including a processor 516, such as one or more processing cores, coupled to a memory 518. The EDA tool 520 may be stored as processor executable instructions at the memory 518 to enable a user of the design computer 514 to design a circuit including the system 100 (or any components thereof, such as the MUX 104, the write pulse generator 106, the sense AMP and comparator 102, the array of MTJ storage elements 108 of FIG. 1, or any combination thereof), of the library file 512. For example, a user of the design computer 514 may enter circuit design information 522 via a user interface 524 coupled to the design computer 514. The circuit design information 522 may include design information representing at least one physical property of a semiconductor device, such as system 100 (or any components thereof, such as the MUX 104, the write pulse generator 106, the sense AMP and comparator 102, the array of MTJ storage elements 108 of FIG. 1, or any combination thereof). To illustrate, the circuit design property may include identification of particular circuits and relationships to other elements in a circuit design, positioning information, feature size information, interconnection information, or other information representing a physical property of a semiconductor device.

The design computer 514 may be configured to transform the design information, including the circuit design information 522, to comply with a file format. To illustrate, the file formation may include a database binary file format representing planar geometric shapes, text labels, and other information about a circuit layout in a hierarchical format, such as a Graphic Data System (GDSII) file format. The design computer 514 may be configured to generate a data file including the transformed design information, such as a GDSII file 526 that includes information describing the system 100 (or any components thereof, such as the MUX 104, the write pulse generator 106, the sense AMP and comparator 102, the array of MTJ storage elements 108 of FIG. 1, or any combination thereof), in addition to other circuits or information. To illustrate, the data file may include information corresponding to a system-on-chip (SOC) that includes the system 100 (or any components thereof, such as the MUX 104, the write pulse generator 106, the sense AMP and comparator 102, the array of MTJ storage elements 108 of FIG. 1, or any combination thereof), and that also includes additional electronic circuits and components within the SOC.

The GDSII file 526 may be received at a fabrication process 528 to manufacture the system 100 (or any components thereof, such as the MUX 104, the write pulse generator 106, the sense AMP and comparator 102, the array of MTJ storage elements 108 of FIG. 1, or any combination thereof), according to transformed information in the GDSII file 526. For example, a device manufacture process may include providing the GDSII file 526 to a mask manufacturer 530 to create one or more masks, such as masks to be used with photolithography processing, illustrated as a representative mask 532. The mask 532 may be used during the fabrication process to generate one or more wafers 534, which may be tested and separated into dies, such as a representative die 536. The die 536 includes a circuit including a device that includes the system 100 (or any components thereof, such as the MUX 104, the write pulse generator 106, the sense AMP and comparator 102, the array of MTJ storage elements 108 of FIG. 1, or any combination thereof).

The die 536 may be provided to a packaging process 538 where the die 536 is incorporated into a representative package 540. For example, the package 540 may include the single die 536 or multiple dies, such as a system-in-package (SiP) arrangement. The package 540 may be configured to conform to one or more standards or specifications, such as Joint Electron Device Engineering Council (JEDEC) standards.

Information regarding the package 540 may be distributed to various product designers, such as via a component library stored at a computer 546. The computer 546 may include a processor 548, such as one or more processing cores, coupled to a memory 550. A printed circuit board (PCB) tool may be stored as processor executable instructions at the memory 550 to process PCB design information 542 received from a user of the computer 546 via a user interface 544. The PCB design information 542 may include physical positioning information of a packaged semiconductor device on a circuit board, the packaged semiconductor device corresponding to the package 540 including the system 100 (or any components thereof, such as the MUX 104, the write pulse generator 106, the sense AMP and comparator 102, the array of MTJ storage elements 108 of FIG. 1, or any combination thereof).

The computer 546 may be configured to transform the PCB design information 542 to generate a data file, such as a GERBER file 552 with data that includes physical positioning information of a packaged semiconductor device on a circuit board, as well as layout of electrical connections such as traces and vias, where the packaged semiconductor device corresponds to the package 540 including the system 100 (or any components thereof, such as the MUX 104, the write pulse generator 106, the sense AMP and comparator 102, the array of MTJ storage elements 108 of FIG. 1, or any combination thereof). In other embodiments, the data file generated by the transformed PCB design information may have a format other than a GERBER format.

The GERBER file 552 may be received at a board assembly process 554 and used to create PCBs, such as a representative PCB 556, manufactured in accordance with the design information stored within the GERBER file 552. For example, the GERBER file 552 may be uploaded to one or more machines to perform various steps of a PCB production process. The PCB 556 may be populated with electronic components including the package 540 to form a representative printed circuit assembly (PCA) 558.

The PCA 558 may be received at a product manufacture process 560 and integrated into one or more electronic devices, such as a first representative electronic device 562 and a second representative electronic device 564. As an illustrative, non-limiting example, the first representative electronic device 562, the second representative electronic device 564, or both, may be selected from the group of a mobile phone, a set top box, a music player, a video player, an entertainment unit, a navigation device, a communications device, a personal digital assistant (PDA), a fixed location data unit, and a computer, into which the system 100 (or any components thereof, such as the MUX 104, the write pulse generator 106, the sense AMP and comparator 102, the array of MTJ storage elements 108 of FIG. 1, or any combination thereof), are integrated. As another illustrative, non-limiting example, one or more of the electronic devices 562 and 564 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 5 illustrates remote units according to teachings of the disclosure, the disclosure is not limited to these illustrated units. Embodiments of the disclosure may be suitably employed in any device which includes active integrated circuitry including memory and on-chip circuitry.

A device that includes the system 100 (or any components thereof, such as the MUX 104, the write pulse generator 106, the sense AMP and comparator 102, the array of MTJ storage elements 108 of FIG. 1, or any combination thereof), may be fabricated, processed, and incorporated into an electronic device, as described in the illustrative process 500. One or more aspects of the embodiments disclosed with respect to FIGS. 1-4 may be included at various processing stages, such as within the library file 512, the GDSII file 526, and the GERBER file 552, as well as stored at the memory 510 of the research computer 506, the memory 518 of the design computer 514, the memory 550 of the computer 546, the memory of one or more other computers or processors (not shown) used at the various stages, such as at the board assembly process 554, and also incorporated into one or more other physical embodiments such as the mask 532, the die 536, the package 540, the PCA 558, other products such as prototype circuits or devices (not shown), or any combination thereof. Although various representative stages of production from a physical device design to a final product are depicted, in other embodiments fewer stages may be used or additional stages may be included. Similarly, the process 500 may be performed by a single entity or by one or more entities performing various stages of the process 500.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
  performing a memory write operation at a magnetic tunnel junction (MTJ) storage element by, during a single memory clock cycle:
    reading a first value stored at the MTJ storage element;
    receiving a logic value from a multiplexer (MUX) during the memory write operation;
    comparing the first value to the logic value; and
    selectively writing the logic value to the MTJ storage element based on the comparison; and
  performing a memory read operation at the MTJ storage element, wherein the memory read operation includes receiving a reference value from the MUX.

2. The method of claim 1, wherein the logic value is written to the MTJ storage element in response to determining that the first value does not match the logic value.

3. The method of claim 1, further comprising refraining from writing the logic value to the MTJ storage element in response to determining that the first value matches the logic value.

4. The method of claim 1, further comprising, during the single memory clock cycle:
reading a first plurality of values stored at an array of MTJ storage elements, wherein the first plurality of values includes the first value and wherein the array of MTJ storage elements includes the MTJ storage element;
comparing each of the first plurality of values to each of a second plurality of values, wherein the second plurality of values includes the logic value and wherein the second plurality of values is to be written to the array of MTJ storage elements; and
selectively writing each of the second plurality of values to a corresponding MTJ storage element of the array of MTJ storage elements based on the comparison of each of the first plurality of values to each of the second plurality of values.

5. The method of claim 1, further comprising reading the first value using a first current and writing the logic value to the MTJ storage element using a second current, wherein the second current has a greater magnitude than the first current.

6. The method of claim 1, further comprising reading the first value during a first time period and writing the logic value to the MTJ storage element during a second time period, and wherein the second time period is longer than the first time period.

7. The method of claim 1, wherein the first value is read within a first half of the single memory clock cycle.

8. An apparatus comprising:
a multiplexer (MUX) configured to output a logic value during a write operation and to output a reference value during a read operation; and
circuitry coupled to a magnetic tunnel junction (MTJ) storage element, wherein the circuitry is configured, during a single memory clock cycle of a memory write operation, to:
receive a first value stored at the MTJ storage element;
receive the logic value from the MUX;
compare the first value to the logic value; and
selectively enable a write of the logic value to the MTJ storage element based on the comparison.

9. The apparatus of claim 8, wherein the circuitry is further configured to enable the write by generating a write enable signal in response to determining that the first value does not match the logic value.

10. The apparatus of claim 8, wherein the MUX includes a first input configured to receive the reference value, a second input configured to receive the logic value, a third input configured to receive a control signal, and an output, wherein the control signal is configured to indicate the read operation or the write operation, and wherein the output value corresponds to the reference value in response to the control signal having a first value that indicates the read operation and the output value corresponds to the logic value in response to the control signal having a second value that indicates the write operation.

11. The apparatus of claim 10, wherein the MUX is configured to provide the reference value during a memory read operation based on the control signal having a first value that indicates the read operation.

12. The apparatus of claim 8, wherein the circuitry is further configured to transmit the write enable signal to a write pulse generator, the write pulse generator configured to enable a write of the logic value to the MTJ storage element in response to the write enable signal.

13. The apparatus of claim 8, wherein the circuitry is further configured, during the single memory clock cycle, to:
receive a first plurality of values stored at an array of MTJ storage elements, wherein the first plurality of values includes the first value and wherein the array of MTJ storage elements includes the MTJ storage element;
receive a second plurality of values to be written to the array of MTJ storage elements, wherein the second plurality of values includes the logic value;
compare the first plurality of values to the second plurality of values; and
selectively enable a write of each of the second plurality of values to a corresponding MTJ storage element of the array of MTJ storage elements based on the comparison of the first plurality of values to the second plurality of values.

14. The apparatus of claim 13, wherein the first plurality of values is received within a first half of the single memory clock cycle.

15. The apparatus of claim 8, wherein the circuitry is integrated into at least one semiconductor die.

16. The apparatus of claim 8, further comprising a device selected from a group consisting of a mobile phone, a set top box, a music player, a video player, an entertainment unit, a navigation device, a communications device, a personal digital assistant (PDA), a fixed location data unit, and a computer, into which the circuitry is integrated.

17. The apparatus of claim 8, wherein the circuitry includes a sense amplifier and a comparator.

18. The apparatus of claim 8, wherein the circuitry is further configured to:
after the write of the logic value to the MTJ storage element is complete, receive the reference value from the MUX;
compare the logic value to the reference value; and
selectively enable a second write of the reference value to the MTJ storage element based on the comparison.

19. An apparatus comprising:
an array of magnetic tunnel junction (MTJ) storage elements including a first MTJ storage element;
a multiplexer (MUX) configured to, during a single memory clock cycle, output a logic value during a memory write operation and to output a reference value during a memory read operation;
circuitry coupled to the array of MTJ storage elements and to the MUX, wherein the circuitry is configured, during the memory write operation, to:
receive a first value stored at the first MTJ storage element;
receive the logic value from the MUX;
compare the first value to the logic value;
selectively transmit a write enable signal to a write pulse generator based on the comparison; and
wherein the circuitry is configured, during the memory read operation, to receive the reference value from the MUX.

20. The apparatus of claim 19, wherein the write pulse generator is configured to enable a write of the logic value to the MTJ storage element in response to the write enable signal.

21. The apparatus of claim 19, wherein the MUX is configured to receive a control signal having a value that indicates the memory read operation or the memory write operation.

22. The apparatus of claim 21, wherein the MUX is configured to output the logic value to the circuitry based on the memory write operation indicated by the control signal, and wherein the MUX is configured to output a reference value based on the memory read operation indicated by the control signal.

23. The apparatus of claim 19, wherein the circuitry is further configured to transmit the write enable signal to the write pulse generator in response to a determination that the first value is different from the logic value.

24. The apparatus of claim 19, wherein the circuitry is further configured to refrain from transmission of the write enable signal to the write pulse generator in response to a determination that the first value matches the logic value.

25. The apparatus of claim 19, wherein the circuitry is further configured to receive the first value, to receive the logic value, and to selectively transmit the write enable signal during a single memory clock cycle.

26. The apparatus of claim 19, wherein the circuitry is further configured to:
receive a first plurality of values stored at the array of MTJ storage elements, wherein the first plurality of values includes the first value;
receive a second plurality of values from the MUX, the second plurality of values to be written to the array of MTJ storage elements, wherein the second plurality of values includes the logic value;
compare the first plurality of values to the second plurality of values; and
selectively transmit write enable signals to a plurality of write pulse generators based on the comparison of the first plurality of values to the second plurality of values.

27. The apparatus of claim 19, wherein the array of MTJ storage elements, the MUX, the circuitry, and the write pulse generator are integrated into at least one semiconductor die, and wherein the circuitry includes a sense amplifier and a comparator.

28. The apparatus of claim 19, further comprising a device selected from the group consisting of a mobile phone, a set top box, a music player, a video player, an entertainment unit, a navigation device, a communications device, a personal digital assistant (PDA), a fixed location data unit, and a computer, into which the array of MTJ storage elements, the MUX, the circuitry, and the write pulse generator are integrated.

29. An apparatus comprising:
means for storing a plurality of data elements including a first data element;
means for receiving a first value stored at the first data element;
means for receiving a logic value from a multiplexer (MUX) during a memory write operation and a reference value from the MUX during a memory read operation;
means for comparing the first value to a second value; and
means for selectively transmitting a write enable signal to means for generating a write pulse based on a result from the means for comparing, wherein the write pulse enables a write of the second value to the first data element.

30. The apparatus of claim 29, further comprising a device selected from a group consisting of a mobile phone, a set top box, a music player, a video player, an entertainment unit, a navigation device, a communications device, a personal digital assistant (PDA), a fixed location data unit, and a computer, into which the means for storing, the means for receiving the first value, the means for receiving the logic value, the means for comparing, the means for selectively transmitting, and the means for generating the write pulse are integrated.

* * * * *